United States Patent [19]
> Heuber et al.
>
> [11] 4,122,548
> [45] Oct. 24, 1978

[54] MEMORY STORAGE ARRAY WITH RESTORE CIRCUIT

[75] Inventors: Klaus Heuber, Boeblingen; Wilfried Klein, Holzgerlingen; Knut Najmann, Gartringen; Friedrich Wernicke, Boeblingen; Siegfried Kurt Wiedmann, Stuttgart, all of Germany

[73] Assignee: International Business Machines Corporation, Armonk, N.Y.

[21] Appl. No.: 840,457

[22] Filed: Oct. 7, 1977

[30] Foreign Application Priority Data

Dec. 18, 1976 [DE] Fed. Rep. of Germany ....... 2657561

[51] Int. Cl.² .............................................. G11C 11/40
[52] U.S. Cl. .................................... 365/203; 365/150; 365/174
[58] Field of Search ................ 365/149, 150, 174, 203

[56] References Cited

U.S. PATENT DOCUMENTS 3,909,631   9/1975   Kitagawa ............................ 365/203

Primary Examiner—Terrell W. Fears
Attorney, Agent, or Firm—Francis J. Thornton

[57] ABSTRACT

A memory storage system which utilizes semiconductor storage cells comprised of cross-coupled bipolar transistors arranged in a memory system array with an error reference circuit and a standby reference circuit that is controlled by a clock signal. The standby reference circuit and the error reference circuit are both coupled to the bit lines and selectively control a restore circuit that maintains, in the standby state, a selected potential on the bit lines such that short access times are realized and current is prevented from flowing into unselected cells when adjacent defective cells are being read or written.

10 Claims, 4 Drawing Figures

MEMORY STORAGE ARRAY WITH RESTORE CIRCUIT

BACKGROUND OF THE INVENTION

1. Field of the Invention

The invention related generally to a restore reference circuit arrangement for a semiconductor memory circuit and more particularly to a restore reference circuit for use with cross-coupled bipolar transistor storage cells.

2. Description of the Prior Art

Memory storage cells comprised of cross-coupled bipolar transistors are described in commonly assigned U.S. Pat. No. 3,354,440. The operation of such cross-coupled bipolar storage cells is described in detail in the above mentioned patent. Cross-coupled bipolar transistor storage cells which use resistors as load elements and schottky diodes as the coupling elements to the bit lines are also taught in the IBM Technical Disclosure Bulletin Vol. 16 No. 6 Nov. 1973 pages 1920 and 1921. The above described cross-coupled bipolar transistor cells are arranged in memory arrays and a number of such cells are connected between the same pair of bit lines. When sensed, the cell node potentials of such cells are slowly charged to the values needed to prevent the storage cell from being affected by read/write operations being performed on an adjacent storage cell. Thus a relatively long time must elaspe before the next read/write cycle can be started in such memory arrays.

RELATED CO-PENDING APPLICATIONS

One solution to this problem of slow charging that ensures a short cycle time and low storage currents without changing the storage cell arrangement, is realized by controlling the bit line currents and the selection phase during which the storage cell is either read or written into. The increased bit line currents encountered in the recovery phase are then used to charge the cell node potentials to values at which the storage cell is no longer affected by read/write operations being performed on other cells coupled to the same bit lines.

This solution is described in co-pending application Ser. No. 662,309 assigned to the same assignee as the present invention and provides high speed semiconductor memory arrays having a very low power disipation and a low overall power consumption. However, it has the disadvantage that the current flowing to the word line in the selected state is high, and the bit line levels are such that the stored contents of other cells coupled to the same bit lines may be changed especially if a defective cell is connected to the bit line pair and a read/write operation is attempted on the defective cell. Because a single defective cell coupled to the bit line may, in such cases, detrimentally affect other storage cells, also coupled to the same bit line, there is no guarantee that a error correction circuit associated with the array will actually eliminate such errors. On the contrary, error correction circuit means coupled to the array may be ineffective and erroneous information may be written into or read from the array under the above described conditions.

SUMMARY OF THE INVENTION

It is the object of the invention to overcome these difficulties and to provide a semiconductor memory array which insures a short access time while avoiding errors caused by attempting to read or to write a defective cell in the array. The present invention achieves this desirable result by providing circuit means for causing the bit line potential to be set at a value which prevents current from flowing into the unselected cells and keeps the line at a level which prevents other storage cells coupled to the bit line from being charged while an adjacent storage cell is either being written or read.

The present invention further has the advantage that a single defective storage cell, within the array which can be compensated for by means of error correction circuitry connected to the array, is prevented from affecting other storage cells in the array.

The present invention further has a short access time for, prior to any reading of the array, the bit line levels are set to an optimum value. As a result of this, word line currents are relatively low, and the total power disipation of the array is drastically reduced while its storage density is significantly increased.

DESCRIPTION OF THE DRAWINGS

These and other features of the present invention will be more fully appreciated and understood by considering the following description taken in conjunction with the accompanying drawings in which.

DESCRIPTION OF THE INVENTION

Figure 1:
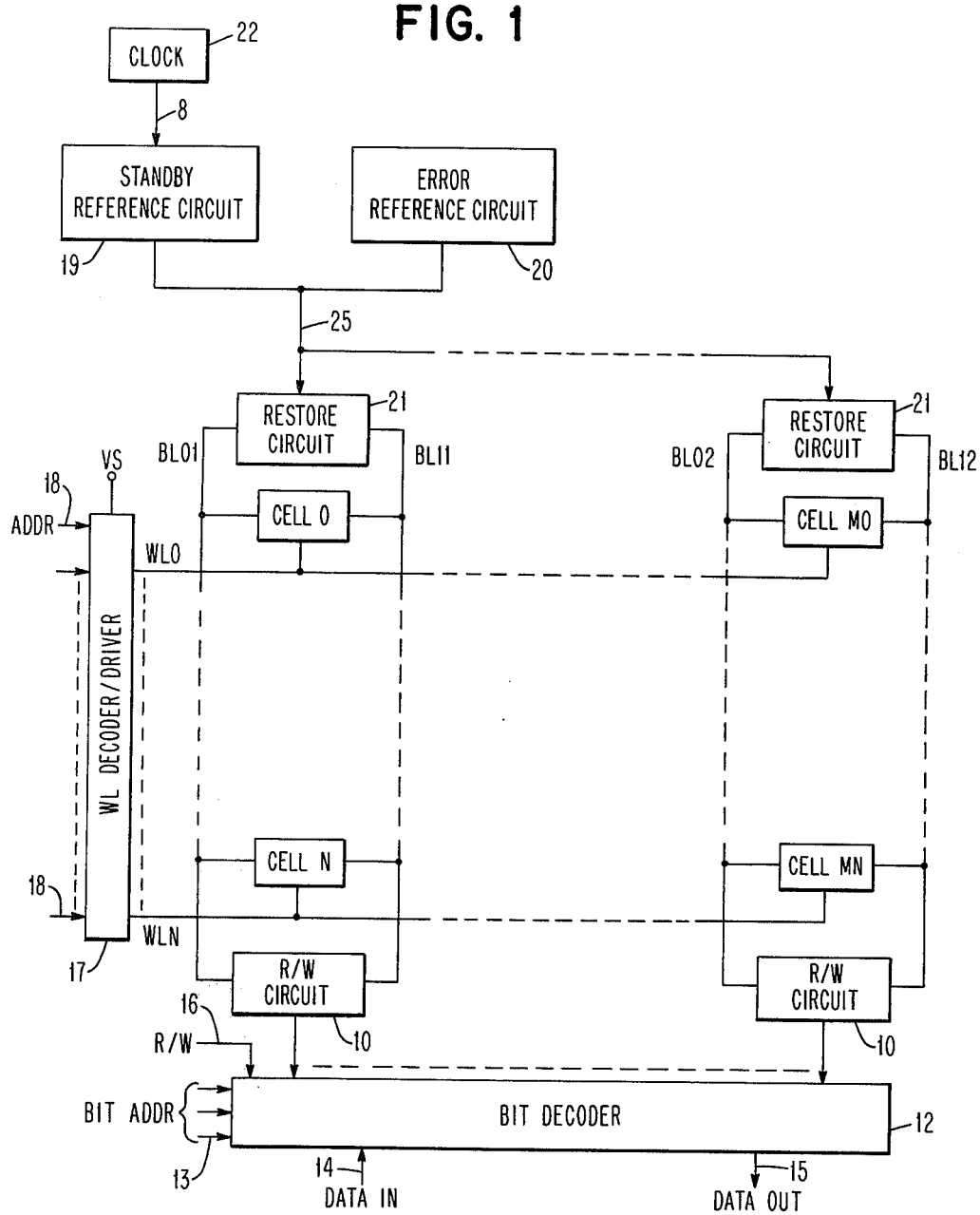
FIG. 1 shows a block diagram of a memory array using in accordance with the present invention.

Shown in FIG. 1 is a block diagram of a memory array, in accordance with the present invention, which comprises two parallel rows of storage cells of which only four, 0 and N, and MO and MN, are shown. Each cell is connected between pairs of respective bit lines BL01 and BL11, and BL02 and BL12. Also connected to each respective pair of bit lines is a respective suitable well known read/write control circuit 10. Each read/write control circuit is connected to a suitable well known bit decoder 12, having a plurality of bit address lines 13, a data in line 14, a data out line 15 and a read/write line 16 coupled thereto. A plurality of words lines of which only two WL0 and WLN, are shown feed out of a word line decoder driver 17, into which are fed address lines 18, and a supply voltage VS. These word lines are coupled to respective cells in the arrays. Thus memory word line WL0 is connected to cells 0 and MO while memory word line WLN is connected to cells N and MN. Each pair of bit lines BL01 and BL11, and BL02 and BL12 are connected to a respective restore circuit 21 and 21a. A standby reference circuit 19 and an error reference circuit 20 are both coupled to the restore circuits via line 25. The standby reference circuit 19 is arranged in parallel with the error reference circuit 20 and is driven by a clock 22.

Figure 2:
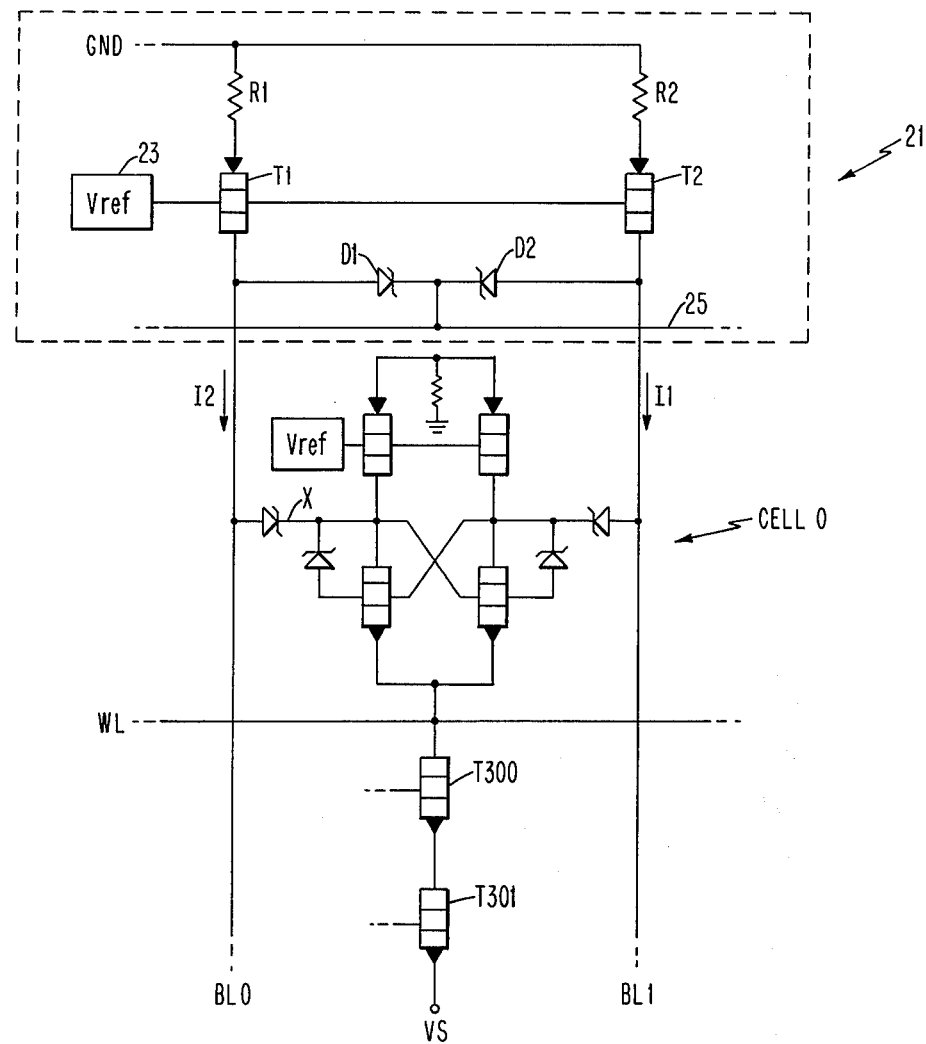
FIG. 2 depicts a circuit arrangement, in accordance with the present invention, for setting the bit line levels and ensuring that a storage cell array containing defective storage cells operates properly.
Figure 3:
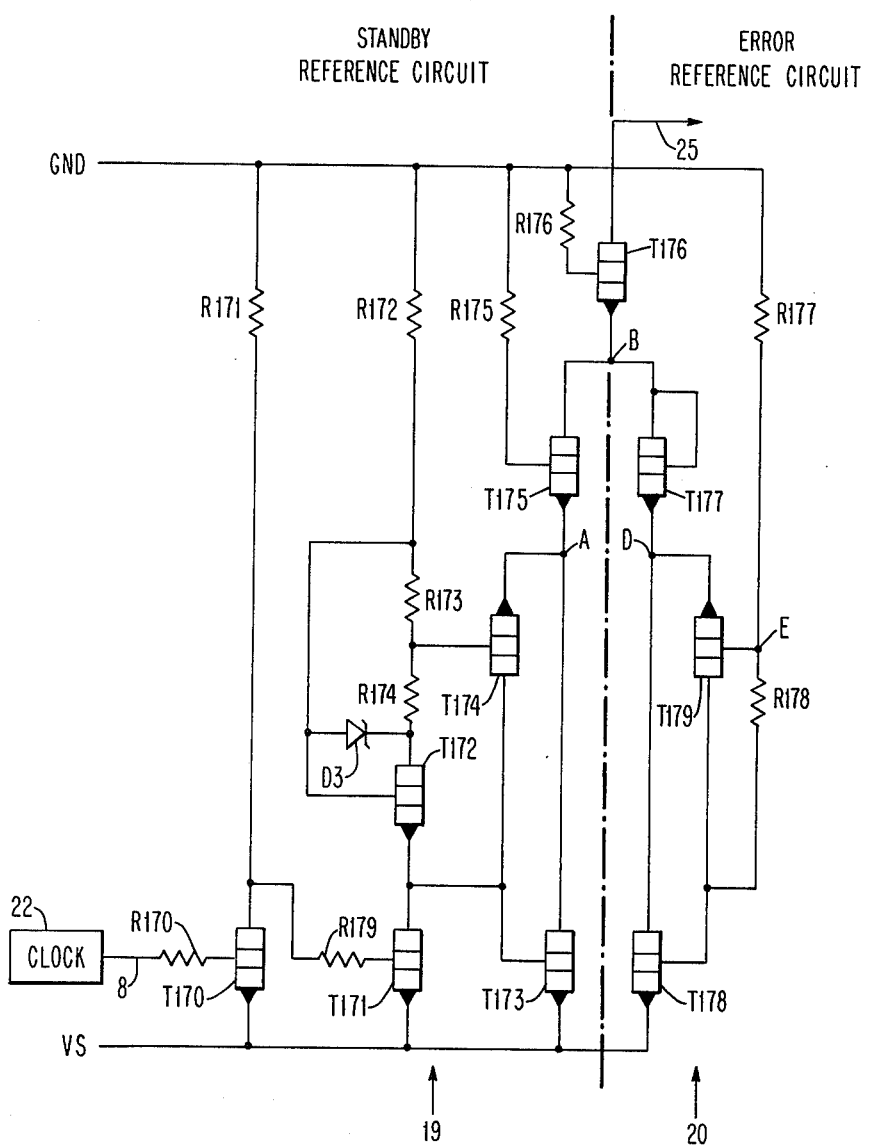
FIG. 3 discloses a detailed schematic of the standby reference circuit and an error reference circuit shown in block form in FIG. 1.

The operation and advantages of the invention will be more fully appreciated if reference is now also made simultaneously to FIGS. 2 and 3.

FIG. 2 depicts in greater detail the restore circuit connected to the bit line pair. Because both restore circuits 21 and 21a are identical only one circuit 21 connected to the bit line pair BL01 and BL11 will be described. The schematic circuit of cell 0 is also shown coupled to these bit lines. Because all the other cells that may also be connected to these bit lines are identical in form and function to cell 0 they are not shown in this figure. Also it should be noted that the cell 0 is well known to those skilled in the art and need not be herein described in detail. The serially connected transistors T300 and T301, coupled to the word line, represent a word line driver circuit.

FIG. 3 depicts in schematic form both the standby reference circuit and the error reference circuit and their interrelationship to each other, to the clock 22 and to the restore circuit 21.

When the cells of the array are neither being written or read their normal state is in a standby condition. This standby condition is realized when the clock 22 is down and the standby reference circuit 19 is on. Circuit 19 being on deactivates the error reference circuit 20 and sets all restore circuits such that the respective bit lines to which they are coupled are maintained at their standby potential.

Specifically in the standby state, the clock 22 applys a positive pulse to the standby reference circuit 19 via line 8 which causes transistor T170 of FIG. 3 to be turned on. When transistor T170 is conductive, transistor T171 is off and transistors T172, T173, and T174 are all conducting. The collector voltage of transistor T172 is limited by the schottky diode D3. Without impairing the tracking characteristics of the circuit, differences in the base to emitter voltages $V_{BE}$ between the transistor T173 and the transistor T174, resulting from different current values, can be compensated for by selection of the division ratio in voltage divider resistors R173 and R174.

As referenced to the voltage supply VS the voltage $V_A$ at node A in the standby reference circuit is:

$$V_A = V_{BE.T172} - \tfrac{1}{2} V_{SBD.D3} + V_{BE.T173} - V_{BE.T174}$$

$$V_A \simeq 550\ mV$$

This means that transistor T175 is on, node B is at about 750 mV and current is being drawn through transistor T176. This causes the voltage on line 25 (leading to the restore circuit 21 to be) $V_A$ (550mV) plus the saturation voltage of transistors T175 and T176, or about 1.0 volts.

The voltage level at point D and E, respectively, of the combination circuit is accordance with the invention is determined by voltage division ratio of resistors R177 and R178. The value obtained (as referred to VS) is:

$$V_E = (V_S + V_{BE})\ R178/R177 + R178 + V_{BE}$$

$$V_D = V_E - V_{BE}$$

$$V_D = (V_S + V_{BE})\ R178/R177 + R178$$

$$= (4.25 - 0.8)\ 0.38/0.38 + 2.43$$

$$= 0.466\ V$$

Thus transistor T177, coupled in a diode configuration, does not conduct during standby and the error reference circuit remains turned off.

The base of transistors T1 and T2 are coupled together and to a voltage reference source 23. The emitter of each transistor T1 and T2 is connected through a respective resistor R1 and R2 to a reference line (ground).

When in standby, the voltage on line 25 is such as to bias the diodes D1 and D2 so current flows through them. Thus a selected portion of the current from the current source transistors T1 and T2 flows through diodes D1 and D2 and maintains the respective bit lines BL01 and BL11 at their standby voltage. In standby the bit line voltage on each of the bit lines, when referenced to VS, is:

$$V_{BL01} = V_{BE} + 2V_{SAT} + \tfrac{1}{2} V_{SBD(D1)}$$

$$V_{BL01} = 0.800\ V + 0.15\ V + 0.25\ V$$

$$V_{BL01} = 1.2\ Volt$$

Both bit lines BL01 and BL11 are both maintained at the same potential.

To read the cell 0 the read/write circuit 10 of FIG. 1 is activated into the read state by suitable means, as is well known in the art. At the same time the bit decoder is activated by a suitable pulse on the read/write line 16. The required word line, in this case WL0 is activated via the word line decoder/driver 17. When activated the world line WL0 is switched to a potential about one volt lower than that imposed during standby. The standby reference circuit is simultaneously turned off by the application of a negative pulse from clock 22 to the base of transistor T170. When transistor T170 turns off it causes transistor T171 to turn on. When transistor T171 becomes conductive the base voltage of transistor T173 is lowered causing transistor T173 to turn off and the current flowing through transistor T176 is altered so that the potential on the output line 25 rises causing diodes D1 and D2 in the restore circuit to turn off. Although diodes D1 and D2 turn off the voltage level on the bit line BL01 and BL11 momentarily remains high until the stray capacitance on the lines decay.

Because the read/write circuit has been activated, a read current flows into the selected cell via the bit lines. The potential on each of the bit lines is determined by the storage state of the cell. The potential on the respective bit lines differ and one line is higher and the other is lower depending on the state of the cell.

During a write operation when no cells are defective, the conditions with regard to the restore circuit, the bit lines, word line, and read/write circuit are similar to those described above. Only the magnitudes of the currents and potentials on the bit lines BL01 and BL11 differ.

In arrays, cells are sometimes found to be defective. Defective cells generate an error signal from the array. If the error signal is caused by a single cell, it can be corrected by using a well known error correction circuit in conjunction with the array.

In certain instances however, the defective cell can create a condition that will affect one or more cells coupled to the same bit lines as the defective cell. The error correction circuit is ineffective to prevent this but the present invention is especially effective and advantageous.

The present invention prevents an error, during reading or writing from propagating itself.

For example, if we assume the cell shown in FIG. 2 has a break in the line, node X, near where it is coupled to the bit line BL01 then, without the present invention, the potential on the bit line BL01 would rise during the write operation to such an extent that current would flow into one or more non-selected cells connected to the bit line. This excess current flowing into the non-selected cells can destroy the stored contents of the non-selected cells.

The present invention however alleviates this problem since it is designed to prevent excess current from flowing into the non-selected cells.

When it is desired to write a 0 in storage cell 0 shown in FIG. 2 the potential on the bit line BL01 is raised. However because of the break in the line at node X this increase in potential on bit line BL01 will not affect the cell 0 but affect other cells that might be coupled to the bit line BL01. To prevent this adverse effect it is necessary that the error reference circuit 20 of the present invention become active so as to prevent an excess potential on the bit line BL01.

As discussed above during a write cycle the standby reference circuit is deactivated by a negative clock signal on line 8. The read/write circuit 10 is set into the write state and the bit decoder and the word decoder/driver circuit are both activated. When a negative clock signal appears on line 8 the transistor T170 is switched off, transistor T171 is switched on and transistor T173 also switches off. When transistor T173 switches off the node B rises to about 1.266 volts before diode transistor T177 turns on, for, as noted above, node D is at 466 mV. This means that the bit line voltage, on either bit line with respect to VS can rise to a maximum voltage of $V_{BLMAX}$ which is:

$$V_{BLMAX} = V_D + V_{BE\ T177} + V_{SAT\ T176} + V_{SBD\ D1}$$

$$= 0.466\ V + 0.8\ V + 0.075\ V + 0.5\ V$$

$$= 1.841\ V$$

In the case where the cell is without defect the maximum bit line voltage does not rise above this voltage of 1.841 volts.

However in the case where the cell is defective i.e. there is a break at node X the cell can not be written and the bit line level will rise above this maximum voltage of 1.841 volts causing transistor T176 and T177 and T178 of the error reference circuit to conduct and maintain the bit lines at this maximum potential of 1.841 volts.

During reading of such a defective cell the condition with regard to the restore circuit, standby reference circuit and error reference circuit are similar to those described above for the write cycle. Only the magnitudes of the currents and potentials on the bit lines BL01 and BL11 differ from those required during writing.

Figure 4:
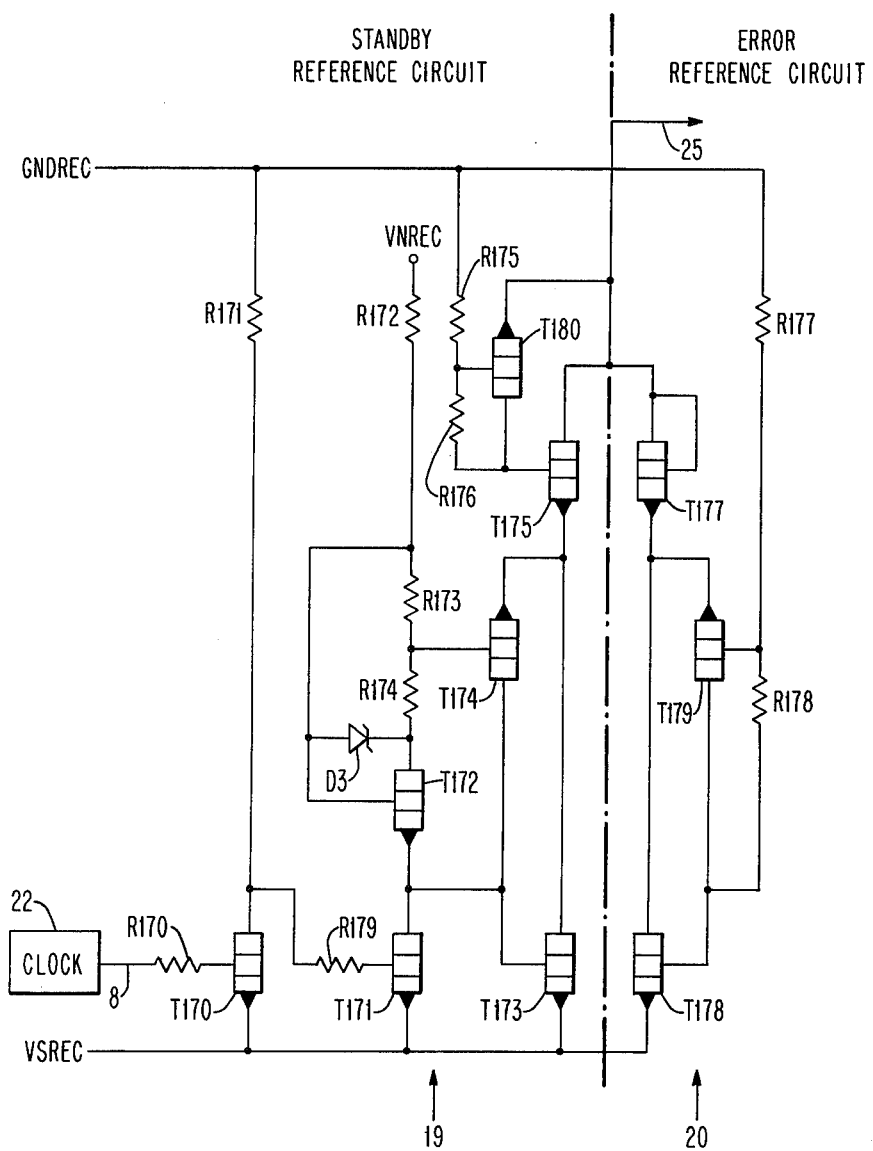
FIG. 4 sets forth a different embodiment of the circuit disclosed in FIG. 3.

FIG. 4 depicts a second embodiment of the standby reference circuit and error reference circuit. The circuit shown in this FIG. 4 differs from that of FIG. 3 in that the saturated transistor T176, common to the standby reference circuit and the error reference circuit is eliminated. Instead transistor T180 is coupled between the output line 25 and the base of transistor T175. By eliminating transistor T176 and substituting transistor T180 the potential of lines 25 is no longer dependent on saturated transistors.

While the invention has been particularly shown and described with reference to the preferred embodiment thereof, it will be understood by those skilled in the art that numerous changes in form and detail of the circuit may be made therein without departing from the spirit and scope of the invention.

What is claimed is:

1. A memory circuit comprising
a pair of bit lines,
bipolar memory cells coupled between the bit lines through semiconductor devices, and
means for maintaining information stored in said cells,
said maintaining means comprising
a standby reference circuit, controlled by a clock, coupled to a reference line,
an error reference circuit coupled to said standby reference circuit and to said reference line, and
a restore circuit coupled to said reference line,
said restore circuit comprising two current sources each of which are coupled to a respective one of said pair of bit lines and to said reference line through a respective one of a pair of semiconductor devices.

2. The circuit of claim 1 wherein said semiconductor devices coupled to the memory cell are Schottky diodes.

3. The circuit of claim 2 wherein said semiconductor devices in said restore circuit are Schottky diodes.

4. The circuit of claim 1 wherein said standby reference circuit comprises a control transistor and a pair of serially connected transistors coupled to the reference line, the conductive state of said serially connected transistors being controlled by said control transistor, and the state of said control transistor being responsive to signals from said clock.

5. The circuit of claim 4 wherein the error reference circuit comprises a pair of serially connected transistors coupled to the reference line, one of said pair of serially connected transistors being connected as a diode.

6. The circuit of claim 5 wherein the standby reference circuit and the error reference circuit are both coupled to the reference line through a common transistor.

7. The circuit of claim 6 wherein said common transistor is saturated.

8. A memory circuit comprising
a word line,
a pair of bit lines,
a bipolar memory cell coupled between the bit lines
means coupled to the word line for selectively setting the word line at first and second voltage levels, said second voltage level being at a magnitude lower than said first voltage level, and
means for maintaining a selected voltage level on each of said bit lines including a pair of current sources each being coupled between a reference voltage and a respective one of said bit lines, and further including means for selectively diverting current flow from said current sources to a current sink during the application of said second voltage level to said word line to maintain the voltage on said bit lines at said selected voltage level.

9. The circuit of claim 8 wherein said means for selectively diverting current flow includes
a standby reference circuit controlled by a clock coupled to an error reference circuit and to each of said bit lines through a respective semiconductor device.

10. The circuit of claim 8 wherein said means for selectively diverting current flow includes
a standby reference circuit,
an error reference circuit,
a common output transistor,
and a pair of semiconductor diodes, said standby reference circuit being coupled to said error reference circuit and through said common output transistor and a respective one of said diodes to a respective one of said pair of bit lines.

* * * * *